United States Patent [19]
Geisler

[11] Patent Number: 5,703,501
[45] Date of Patent: Dec. 30, 1997

US005703501A

[54] APPARATUS AND METHOD FOR PRECHARGING A BUS TO AN INTERMEDIATE LEVEL

[75] Inventor: Joseph P. Geisler, Austin, Tex.

[73] Assignee: Advanced Micro Devices, Inc., Sunnyvale, Calif.

[21] Appl. No.: 563,782

[22] Filed: Nov. 27, 1995

[51] Int. Cl.$^6$ ............................................. H03K 19/017
[52] U.S. Cl. ................................ 326/96; 326/17; 326/86
[58] Field of Search ............................. 326/17, 82, 83, 326/87, 97, 96, 27, 28

[56] References Cited

U.S. PATENT DOCUMENTS

| | | | |
|---|---|---|---|
| 3,838,295 | 9/1974 | Lindell | 365/205 |
| 4,754,170 | 6/1988 | Toda et al. | 326/27 |
| 4,791,321 | 12/1988 | Tanaka et al. | 326/27 |
| 4,983,860 | 1/1991 | Yim et al. | 326/17 |
| 5,105,104 | 4/1992 | Eisle et al. | 326/86 |
| 5,151,621 | 9/1992 | Goto | 326/86 |
| 5,377,149 | 12/1994 | Gaultier | 326/58 |
| 5,541,534 | 7/1996 | Cao et al. | 326/83 |

*Primary Examiner*—Edward P. Westin
*Assistant Examiner*—Benjamin D. Driscoll
*Attorney, Agent, or Firm*—Kevin L. Daffer; Conley, Rose & Tayon

[57] ABSTRACT

An apparatus and method is provided for precharging a conductor within a bus containing a plurality of conductors. The apparatus comprises a precharge circuit which drives an intermediate voltage between VDD and ground upon respective conductors. The precharge driver maintains the intermediate voltage within a range between a first voltage level and a second voltage level, the second voltage level being higher in magnitude than the first voltage level. The precharge voltage defined within an intermediate voltage range is chosen to consume minimal power within the precharge driver. An isolation device can be provided on each conductor for isolating the intermediate, precharged value from a receiver circuit input so as to minimize power consumption of the overall circuit. Precharging to an intermediate value causes logic-driven transitions within the bus to occur at a faster frequency than if the bus were precharged to full rail. Intermediate precharge also minimizes noise crosstalk from transitioning neighboring conductors to a target conductor which is desired not to transition, and wherein the target conductor is interposed between the neighboring conductors.

16 Claims, 2 Drawing Sheets

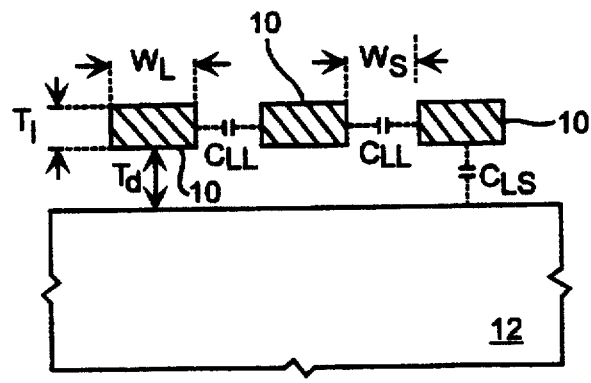
FIG. 1 (PRIOR ART)
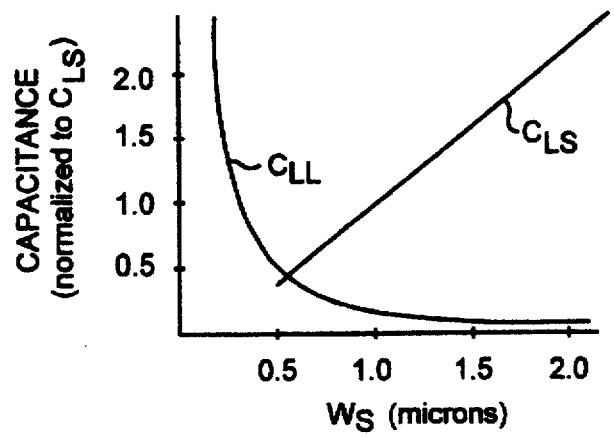
FIG. 2 (PRIOR ART)
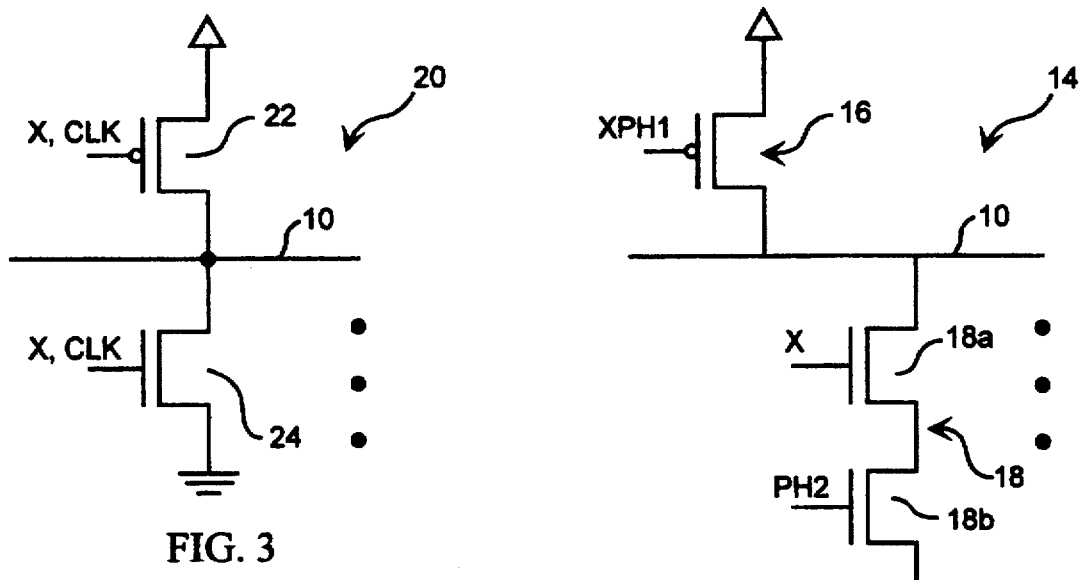
FIG. 3 (PRIOR ART)
FIG. 4 (PRIOR ART)

APPARATUS AND METHOD FOR PRECHARGING A BUS TO AN INTERMEDIATE LEVEL

BACKGROUND OF THE INVENTION

1. Field of the Invention

This invention relates to a multi-conductor bus and more particularly to a plurality of driver circuits which precharge respective conductors to an intermediate voltage level between ground and power supply (VDD).

2. Description of the Relevant Art

A bus is generally defined as a set of interconnect lines (or conductors) which serve to electrically connect two or more components within a system. A collection of voltage levels are forwarded across the bus to allow proper operation of the components. For example, a microprocessor is connected to memories and input/output devices by certain bus structures. There are numerous types of buses which are classified according to their operation. Examples of well known types of buses include address buses, data buses and control buses.

Conductors within a bus generally extend parallel to each other across a semiconductor topography. The conductors are isolated from each other and from underlying conductive elements by a dielectric, a suitable dielectric being, for example, silicon dioxide. FIG. 1 illustrates, in cross section, a series of conductors 10 dielectrically spaced over a semiconductor substrate 12. Conductors 10 are made from a conductive material, a suitable material includes Al, Ti, Ta, W, Mo, polysilicon, or a combination thereof. Substrate 12 includes any type of material which can retain dopant ions and the isolated conductivity regions brought about by those ions. Typically, substrate 12 is a silicon-based material which receives p-type or n-type ions. A channel region interposed between p-type source and drain regions comprise a PMOS device, while a channel region between n-type source and drain regions comprise an NMOS device.

The partial cross-section shown in FIG. 1 indicates a dielectric thickness $T_d$ between conductors 10 and substrate 12. As follows, thickness $T_a$ is partially determinative of the conductor-to-substrate capacitance $C_{LS}$.

$$C_{LS} = eW_LL/T_d \quad \text{(Eq. 1)}$$

where e is the permittivity of the dielectric material, $W_L$ is the conductor width, and L is the conductor length. Resistance of the conductor is calculated as follows:

$$R = (rL)/W_LT_I \quad \text{(Eq. 2)}$$

where r represents resistivity of the conductor material, and $T_I$ is the interconnect thickness. A product of equations 1 and 2 indicates the propagation delay of conductor 10 as follows:

$$RC_{LS} = reL^2/T_IT_d$$

Propagation delay is an important characteristic of an integrated circuit since it limits the speed (frequency) at which the circuit or circuits can operate. The shorter the propagation delay, the higher the speed of the circuit or circuits. It is therefore important that propagation delay be minimized as much as possible given the geometric constraints of the semiconductor topography.

Propagation delay is not merely a function of the line-substrate capacitance. RC delay can also be attributed to the capacitance between conductors 10. Accordingly, propagation delay is determined by parasitic capacitance values between conductors ($C_{LL}$), and the parasitic capacitance values between each conductor and substrate ($C_{LS}$). As circuit density increases, spacing ($W_S$) between conductors 10 decrease and capacitance $C_{LL}$ becomes predominant relative to $C_{LS}$. In other words, line-to-line capacitance $C_{LL}$ increases with decreasing spacing $W_S$ between conductors 10. FIG. 2 illustrates the effect of $W_S$ on $C_{LL}$. As $W_S$ decreases, $C_{LL}$ is shown to increase dramatically as compared to $C_{LS}$. Modern integrated circuits employing narrow interconnect spacing thereby define $C_{LL}$ as the primary parasitic capacitance rather than $C_{LS}$.

Increases in $C_{LL}$ pose two major problems. First, an increase in $C_{LL}$ generally causes an increase in the time at which a transition on the one end of the conductor occurs at the other end. Increase in transition time (i.e., increase in speed degradation) thereby requires a longer drive period. If the conductor is a critical path, speed degradation on that line will jeopardize functionality of the overall circuit. Second, a larger $C_{LL}$ causes an increase in crosstalk noise. A conductor which does not transition, nonetheless receives crosstalk noise from neighboring lines which do.

Speed degradation poses problems primarily during times when a target line transitions opposite the transition of neighboring lines. Speed degradation occurs primarily in statically driven bus conductors. As defined herein, a static bus is one having one or more conductors which can transition from one rail to the other or vice versa. Crosstalk noise, however, poses problems primarily during times when the target line does not transition and the neighboring lines do. Crosstalk is particularly severe in bus conductors which are dynamically driven. As defined herein, a dynamic bus is one having one or more conductors which are precharged during one phase of a clock signal, and driven to a desired logic level during another phase of that clock signal. A dynamic bus thereby requires two separate drive states, a precharge drive state and a logic drive state. The precharge state, arising from a precharge driver, forces each conductor to a precharged value of either VDD or ground. If the dynamic bus utilizes a logic high precharge (i.e., conductors precharged to VDD), it is said to be VDD-precharged. Conversely, a dynamic bus, depending upon its application, can be precharged to ground. Subsequent to precharge, a logic driver circuit causes the precharged conductor to either maintain its precharged value or be driven to the opposing rail. If, for example, a conductor is VDD-precharged, it can thereafter be conditionally discharged during the logic drive state if the desired logic value is zero. Conversely, if the desired logic value is logic high or "1", then the precharged line will not be discharged during the subsequent logic drive state.

FIG. 4 illustrates one of a plurality of conductors 10 within a dynamic bus structure 14. Conductor 10 is precharged by precharge driver 16 during phase 1 (ph1) of a clocking signal, or specifically, a logic inverse of phase 1 (xph1). During subsequent phase 2 (ph2) of the clocking signal, an x logic input is driven onto conductor 10 by logic driver 18. For example, if conductor 10 is VDD-precharged, then a high logic input x can cause discharge of conductor 10 during ph2.

An important advantage in using a dynamic bus, such as that shown by reference 14, is that logic driver 18 causes transition only in one direction. For example, a VDD-precharged conductor 10 can only be conditionally discharged to ground by logic driver 18. Since conductors 10 of dynamic bus 14 can only conditionally transition in one direction during the logic drive state, charge transferal or capacitive coupling between neighboring conductors 10 is roughly one half that of a static bus. Capacitive coupling therefore has less of an effect on speed degradation for a dynamic bus than it has for a static bus. Speed degradation and crosstalk noise are a function of line-to-line capacitive coupling. If charge transfers quickly from one line to a neighboring line, then several problems can occur in a dynamic bus structure. For example a VDD-precharged line may source charge to neighboring lines which transition to ground during a subsequent logic drive state. The precharged line may lose enough voltage to cause a receiving circuit to transition to an undesired state. Crosstalk noise from transitioning neighboring lines can therefore deleteriously effect the proper precharged value of the target line interposed between the neighboring lines.

In addition to or in lieu of dynamic buses, many circuit designs employ a static bus. Instead of precharging a conductor to VDD or ground during a precharge state, thereafter followed by a logic drive state, a static bus simply drives the conductor to the desired logic value without requiring a precharged state. A static bus 20 having one of a plurality of conductors 10 is shown in FIG. 3. Whenever a logic high value is to be driven on conductor 10, PMOS device 22 transitions on while NMOS device 24 transitions off. Conversely, if a logic low value is to be driven on conductor 10, PMOS device 22 is off while NMOS device 24 is on. During times in which the input value x is at an intermediary voltage between VDD minus PMOS threshold and ground plus NMOS threshold, both NMOS device 24 and PMOS device 22 are active on. Accordingly, static bus 20 can consume significant amount of power during the intermediate switching periods. Dynamic bus 14, however, ensures that PMOS device 16 is always off during times in which NMOS devices 18a and 18b are on, and vice versa. Dynamic bus 14 thereby consumes significantly less power than static bus 20. Further, speed of dynamic bus 14 is considerably enhanced because select transistors 16, 18a and 18b can be made much wider without dissipating additional power.

Not only is transition time enhanced by increasing the size of select transistors, but dynamic bus 14 also increases speed due simply to its operation. More specifically, a worse case scenario dictates that conductors neighboring a target conductor do not transition against the transitioning of the target conductor (i.e., transition toward a rail opposite the transitioning of the target conductor). For example, neighboring conductors in a dynamic bus do not transition to VDD during times when a target conductor transitions to ground. Conversely, neighboring conductors often do transition against (i.e., opposite to) the target conductor in a static bus. Neighboring conductors which transition against a transitioning target conductor cause line-to-line capacitive coupling problems attributable to inter alia, speed degradation problems.

While dynamic buses have several advantages over static buses, there are instances where further improvements to conventional dynamic buses are necessary. For example, it would be desirable to further increase the speed of a dynamic bus. The improved dynamic bus must have low power consumption similar to a conventional dynamic bus, however, it must operate at higher transition speed and with lower crosstalk noise than a conventional dynamic bus.

SUMMARY OF THE INVENTION

The problems outlined above are in large part solved by an improved dynamic bus. The improved dynamic bus demonstrates low power consumption, and operates at higher transition speed with lower crosstalk noise than a conventional dynamic bus. The dynamic bus hereof includes a precharge driver and a logic driver for each conductor within the bus. The precharge driver precharges a respective conductor to an intermediary voltage value. The precharge driver charges the conductor to a voltage within a range established between VDD and ground. The upper value of the voltage range is below VDD, and the lower value of the voltage range is above ground but below the upper value.

Precharging each conductor within a bus to a value within an intermediary voltage range serves several purposes. First, the time needed to drive a desired logic value during a logic drive state is reduced. Instead of having to drive a logic value from one rail to the other, the driver circuit need only drive a logic value from an intermediate level to one rail. If, for example, the intermediary value resides at a defined voltage above ground and the logic driver forces the respective line to ground, then the transition time is the time necessary to transition from the defined voltage above ground to ground. Second, the amount of crosstalk noise from transitioning neighboring conductor to a non-transitioning target line is also reduced. The neighboring conductors, in worst case situations, transition only from the defined intermediate voltage amount rather than from one rail to the other. Thus, the maximum voltage change difference resulting from transitioning neighboring conductors is twice the intermediate voltage amount, rather than twice rail-to-rail.

The precharged intermediate voltage upon each conductor is maintained with minimal power consumption. More specifically, the intermediate voltage between the upper value and lower value of the voltage range is defined such that a conductive path cannot be formed between VDD and ground. Any power consumption is due only to subthreshold current between VDD and ground. Accordingly, an intermediate voltage within the desired voltage range does not cause contention between pull-up and pull-down transistors configured within the precharge driver. It is therefore important to note that the improved dynamic bus consumes minimal power during precharge and logic drive states, similar to conventional dynamic buses; however, transitioning target conductors of the improved dynamic bus operate at enhanced speeds while a non-transitioning target line experiences lessened noise crosstalk from transitioning neighbor lines.

Broadly speaking, the present invention contemplates a precharge driver circuit. The precharge driver circuit includes at least one conductor within a bus of conductors. A first pair of transistors is coupled between a power supply (VDD) and the conductor. One of the first pair of transistors includes a gate terminal adapted to receive a clocking signal, and the other of the first pair of transistors includes a gate terminal and a drain terminal coupled together. The driver circuit further includes a second pair of transistors coupled between the conductor and a ground voltage. One of the second pair of transistors includes a gate terminal adapted to receive an inverse clocking signal, and the other of the second pair of transistors includes a gate terminal and a drain terminal coupled together.

The present invention further contemplates a bus. The bus includes a plurality of conductors configured within the bus. A plurality of precharge driver circuits are also included with the bus. Each of the precharge driver circuits precharge a respective one of the plurality of conductors to an intermediate voltage below VDD and above ground. Each of the plurality of precharge driver circuits comprises a pull-up transistor having a selectable path coupled in series with a plurality of first diodes, each first diode having a first turn on threshold. Each of the plurality of precharge driver circuits further comprises a pull-down transistor having a selectable path coupled in series with a plurality of second diodes, each second diode having a second turn on threshold. Each of the plurality of precharge driver circuits still further comprises a clocking signal forwarded to the pull-up and pull-down transistors for increasing voltage upon the conductor if voltage upon the conductor falls below a first amount, or for decreasing voltage upon the conductor if voltage upon the conductor rises above a second amount. The first amount is defined as the lower value of the voltage range, and is equal to a defined voltage below VDD. The second amount is defined as the upper value of the voltage range, and as a defined voltage above ground.

The present invention yet further contemplates a method for precharging a conductor within a bus. The method includes providing a clocking signal to a pull-up circuit and to a pull-down circuit. The pull-up circuit is coupled between VDD and the conductor, while the pull-down circuit is coupled between ground and the conductor. VDD is defined as a power supply voltage magnitude greater than ground, and is preferably 3.0 volts to 5.0 volts. The pull-up circuit is activated if voltage upon the conductor falls below a first amount, and the pull-down circuit is activated if voltage upon the conductor rises above a second amount greater in voltage and magnitude than the first amount.

BRIEF DESCRIPTION OF THE DRAWINGS

Other objects and advantages of the invention will become apparent upon reading the following detailed description and upon reference to the accompanying drawings in which:

FIG. 1 is a partial cross-sectional view of an integrated circuit topography with conductors dielectrically spaced apart and above a semiconductor substrate;

FIG. 2 is a graph of conductor-to-conductor as well as conductor-to-substrate capacitance plotted as a function of line spacing;

FIG. 3 is an exemplary circuit diagram of one conductor within a statically driven bus;

FIG. 4 is an exemplary circuit diagram of one conductor within a dynamically driven bus;

Figure 5:
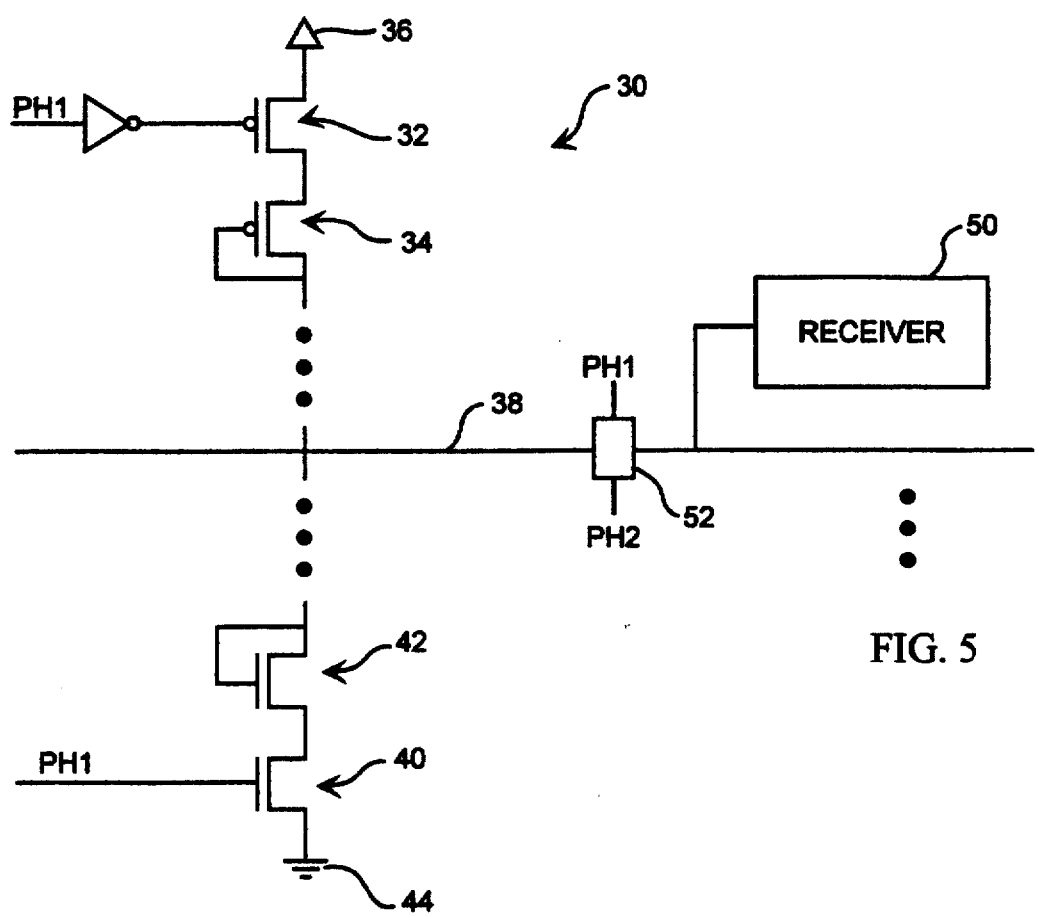
FIG. 5 is a circuit diagram of a precharge driver coupled to a conductor for precharging the conductor to an intermediate value according to the present dynamic bus.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE INVENTION

Turning now to the drawings, FIG. 5 is a circuit diagram of a precharge driver 30 of the present invention. Precharge driver 30 includes at least two transistors 32 and 34 coupled between power supply 36 and each conductor 38 within a dynamic bus. Precharge driver 30 further includes at least two transistors 40 and 42 coupled between ground 44 and conductor 38. Transistors 32 and 40 function as pull-up and pull-down transistors, respectively. Transistors 32 and 40 are active (i.e., form a conditional path from source-to-drain) during times in which a precharge phase ph1 of a clocking signal is active high. Specifically, if ph1 is high (exceeding the turn-on threshold) of transistors 32 and 40 then transistors 32 and 40 switch conditionally on. While transistors 32 and 40 may be on, current does not flow unless conductor 38 voltage is at a desired level. If conductor 38 voltage is below a first voltage amount (defined as a certain number of thresholds below VDD), then current will flow through the source-drain paths of transistor 32 and diode-connected transistor 34. The defined amount by which the first voltage is below VDD is established as one or more turn-on thresholds of diode-coupled transistors 34. Transistor (or transistors) 34 thusly coupled represents a diode (or diodes) having a p terminal coupled to the drain terminal of transistor 32 and an n terminal coupled to possibly another gate-to-drain coupled transistor 34, or to conductor 38. Similar to turn-on of pull-up transistor 32, pull-down transistor 40 is active during ph1, which causes current to flow when voltage on conductor 38 exceeds a second voltage amount above ground. Again, the defined amount is equal to the sum of turn-on threshold voltages of diode-configured transistors 42.

The voltage upon conductor 38 is advantageously set to a voltage residing between VDD and ground. More specifically, voltage upon conductor 38 is maintained within a range between the first and second voltage levels, the second voltage level being higher in magnitude than the first voltage level. The second voltage level is defined as ground plus one or more diode turn-on thresholds attributed to transistors 42. The first voltage level is defined as VDD minus one or more diode turn-on thresholds attributed to transistors 34. Whenever precharge voltage on conductor 38 exceeds the second level, pull-down transistor 40 will cause discharge of conductor 38 during ph1 of the clocking signal. Discharge, however, is limited to a certain number of thresholds below VDD, and therefore, discharge cannot go below the first level. Conversely, if voltage on conductor 38 is lessened below the first level, then pull-up transistor 32 will charge conductor 38 no further than the second level defined as a certain number of thresholds above ground.

Precharge driver 30 functions to precharge conductor 38 to an intermediate voltage level between the first level and the second level, wherein the first level according to one exemplary embodiment is between ground and VDD/2, and wherein the second level is preferably between VDD/2 and VDD. The intermediate voltage precharged on conductor 38 is defined above ground plus one or more diode turn-on thresholds (second level) and below VDD minus one or more diode turn-on thresholds (first level). The intermediate voltage range is chosen so as not to cause both pull-up and pull-down transistors 32 and 40 to turn on simultaneously. There is, therefore, no contention between pull-up and pull-down transistors 32 and 40. Absent a direct path between VDD and ground, the present precharge driver 30 consumes minimal power. The only current existing between VDD and ground is a subthreshold current generally in the picoampere range.

FIG. 5 illustrates, in addition to precharge driver 30, a receiver circuit 50. Receiver 50 is defined as any load coupled to receive a logic driven voltage upon conductor 38. Receiver 50, however, is shown according to a preferred embodiment, isolated from the precharged voltage on conductor 38 by an isolation circuit 52. Isolation circuit, suitably a transmission gate, isolates voltage on conductor 38 from receiver 50 input during clocking phase ph1. However, during clocking phase ph2, the voltage on conductor 38 is passed to receiver 50. Isolation circuit 52 is thereby used to prevent the precharged, intermediate voltage on conductor 38 from forming a VDD-to-ground path within the CMOS devices of receiver 50. When a logic driver (not shown in FIG. 5) forwards a logic high (VDD) or a logic low (ground) onto conductor 38, isolation device 52 passes that logic level to receiver 50. The logic level driven into receiver 50 is of sufficient high or low voltage levels so as not to cause VDD-to-ground NMOS and PMOS transistors to simultaneously turn-on.

Figure 6:
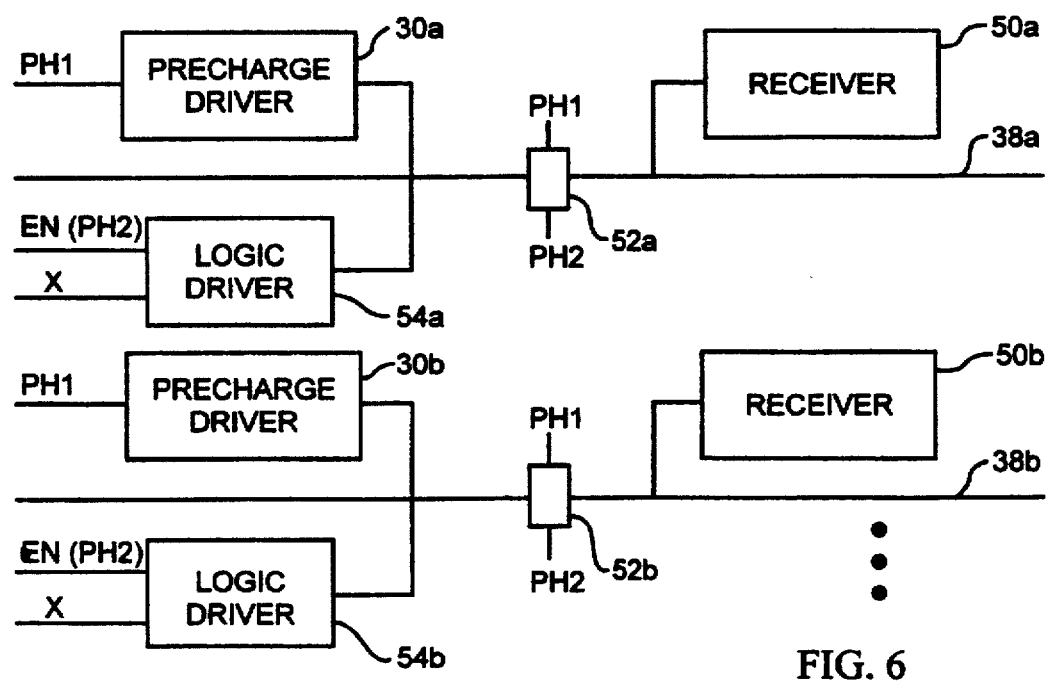
FIG. 6 is a block diagram of precharge drivers and logic drivers associated with each conductor of the present dynamic bus.

Turning now to FIG. 6, a plurality of conductors 38a, 38b, etc. are shown. Conductors 38a, 38b, etc. make up a dynamic bus. Each conductor includes a precharge driver 30a, 30b, etc. and a logic driver 54a, 54b, etc. Further, each conductor includes an isolation device 52a, 52b, etc., and a receiver 50a, 50b, etc. Subsequent to a precharge state in which a precharge voltage is placed on conductor 38, logic driver 54 presents a logic voltage on conductor 38 derived from input logic value x. Each logic driver is enabled during a second phase of a clocking signal, the first phase being that used to activate the precharge drivers 30.

It will be appreciated to those skilled in the art having the benefit of this disclosure that this invention is believed to be capable of precharging any bus having a plurality of conductors. The precharge driver hereof precharges respective conductors to an intermediate voltage level within a range set between VDD and ground. The precharge driver operates during a portion of a clock cycle defined as ph1 of that clock cycle. Subsequent to the precharge state, a logic driver either charges the precharge conductor to VDD or discharges the precharge conductor to ground, depending upon the logic state of the input signal. It is to be understood that the form of the invention shown and described is to be taken merely as presently preferred examples of how precharge drivers and logic drivers forward voltages upon respective bus conductors.

Various modifications and changes may be made to the above precharge driver and logic driver circuitry without departing from the spirit and scope of the invention as set forth in the claims. It is noted that the first and second voltage levels are defined by the turn-on threshold voltages of one or more diode-configured PMOS transistors 34 and one or more diode-configured NMOS transistors 42. For example, the predefined voltage can be three threshold values (i.e., the first level can be three threshold values below VDD, and the second voltage level can be three threshold values above ground) if three PMOS transistors 34 and three NMOS transistors 42 have respective gates connected to respective drains to form a diode arrangement. Accordingly, the upper and lower values of the intermediate voltage range is defined by the number of diode-connected transistors 34 and 42 coupled between conductor 38 and respective transistor 32 and 40. By making the number of source-to-drain coupled transistors 34 greater or less than the number of source-to-drain coupled transistors 42, the defined voltage range can be skewed from a VDD/2 medium to a medium which either exceeds or is less than VDD/2. It is intended that the following claims be interpreted to embrace all such modifications and changes.

What is claimed is:

1. A driver circuit, comprising:
   a first pair of transistors coupled between a power supply and a conductor within a bus of conductors, wherein one of the first pair of transistors includes a gate terminal adapted to receive a clocking signal, and wherein the other of said first pair of transistors includes a gate terminal and a drain terminal coupled together; and
   a second pair of transistors coupled between a ground and said conductor, wherein one of the second pair of transistors includes a gate terminal adapted to receive an inverse clocking signal, and wherein the other of the second pair of transistors includes a gate terminal and a drain terminal coupled together.

2. The driver circuit as recited in claim 1, wherein said first pair of transistors comprise PMOS transistors.

3. The driver circuit as recited in claim 1, wherein said second pair of transistors comprise NMOS transistors.

4. The driver circuit as recited in claim 1, wherein the first pair of transistors each include a selectable path coupled in series to form a path between said power supply and said conductor.

5. The driver circuit as recited in claim 4, wherein the selectable path is formed during times in which said clocking signal is active and when the voltage upon said conductor is below a first amount.

6. The driver circuit as recited in claim 1, wherein the second pair of transistors each include a selectable path coupled in series to form a path between said conductor and said ground.

7. The driver circuit as recited in claim 6, wherein the selectable path is formed during times in which said clocking signal is active and when the voltage upon said conductor is above a second amount.

8. The driver circuit as recited in claim 1, further comprising:
   at least one PMOS transistor having a source and drain path coupled in series between the first pair of transistors and said conductor; and
   at least one NMOS transistor having a source and drain path coupled in series between the second pair of transistors and said conductor.

9. A bus, comprising:
   a plurality of conductors configured within said bus;
   a plurality of precharge driver circuits, each of which are configured to precharge a respective one of said plurality of conductors to a voltage below a power supply voltage and above ground, each of said plurality of driver circuits comprises:
   a pull-up transistor having a selectable path coupled in series with a plurality of first diodes, each first diode having a first turn on threshold;
   a pull-down transistor having a selectable path coupled in series with a plurality of second diodes, each second diode having a second turn on threshold; and
   a clocking signal forwarded to said pull-up and pull-down transistors for increasing voltage upon said conductor if voltage upon said conductor falls below a first amount, and for decreasing voltage upon said conductor if voltage upon said conductor rises above a second amount which is greater in magnitude than said first amount.

10. The bus as recited in claim 9, further comprising an isolation device coupled between each of said plurality of conductors and a receiver circuit.

11. The bus as recited in claim 9, further comprising a plurality of driver circuits, each of which are coupled to a respective one of said plurality of conductors for driving a static voltage thereon during times when said clocking signal is inactive.

12. The bus as recited in claim 9, wherein said first amount is a voltage magnitude equal to the power supply voltage minus a cumulative of the first turn on threshold of the plurality of first diodes.

13. The bus as recited in claim 9, wherein said second amount is a voltage magnitude equal to the ground voltage plus a cumulative of the second turn on threshold of the plurality of second diodes.

14. A method for precharging a conductor within a bus, comprising:

providing a clocked pull-up circuit coupled between a power supply and said conductor, and providing a clocked pull-down circuit coupled between said conductor and a ground voltage;

applying a clocking signal simultaneously to said pull-up and pull-down circuits;

activating said pull-up circuit if voltage upon said conductor falls below a first amount; and activating said pull-down circuit if voltage upon said conductor rises above a second amount greater in voltage magnitude than said first amount.

15. The method as recited in claim 14, wherein said first amount is a multiple of diode thresholds below the voltage upon said power supply.

16. The method as recited in claim 14, wherein said second amount is a multiple of diode thresholds above ground.

* * * * *